United States Patent [19]

Bench

[11] 4,292,599
[45] Sep. 29, 1981

[54] LOW PASS ACTIVE FILTER

[75] Inventor: Stephen M. Bench, Huntington Beach, Calif.

[73] Assignee: The Anaconda Company, New York, N.Y.

[21] Appl. No.: 4,707

[22] Filed: Jan. 19, 1979

[51] Int. Cl.² .............................................. H03F 3/04
[52] U.S. Cl. .................................... 330/290; 330/294; 330/295; 330/296; 330/306
[58] Field of Search ............... 330/290, 295, 296, 302, 330/303, 306, 294; 179/15 FD

[56] References Cited

U.S. PATENT DOCUMENTS 3,475,561 10/1969 Krasin et al. ................... 179/15 FD
3,541,463 11/1970 Zai ........................................ 330/303
3,863,173 1/1975 Scheib et al. ................... 330/306 X

*Primary Examiner*—James B. Mullins
*Attorney, Agent, or Firm*—William W. Haefliger

[57] ABSTRACT

A low pass active filter comprises multiple stages including multiple active devices, circuitry including resistance and capacitance AC coupling the stages in series sequence, and high impedance biasing resistance coupled between the first and last stage inputs, whereby the DC operating point is determined by one active device.

8 Claims, 3 Drawing Figures

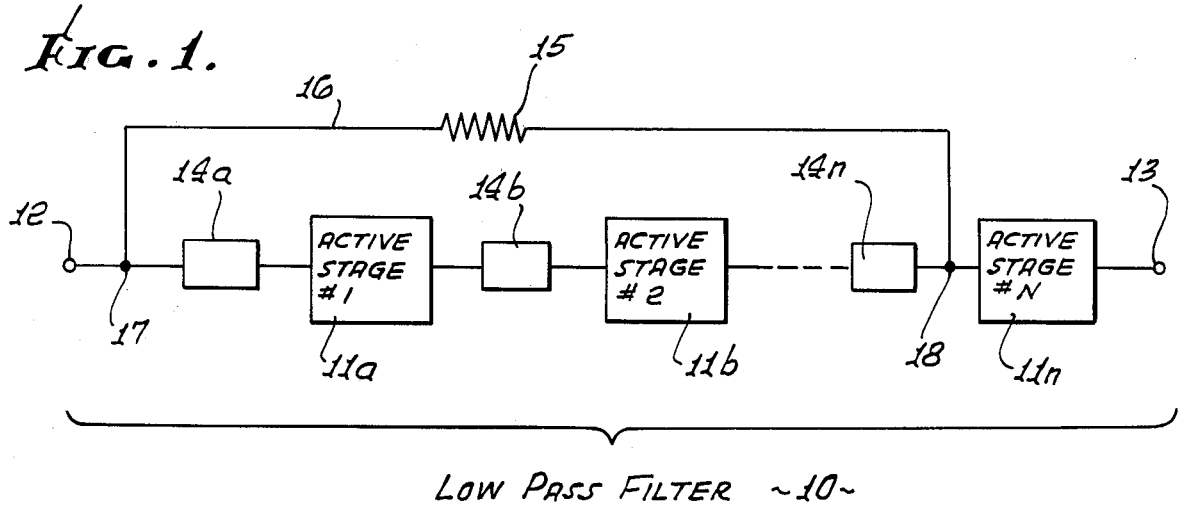
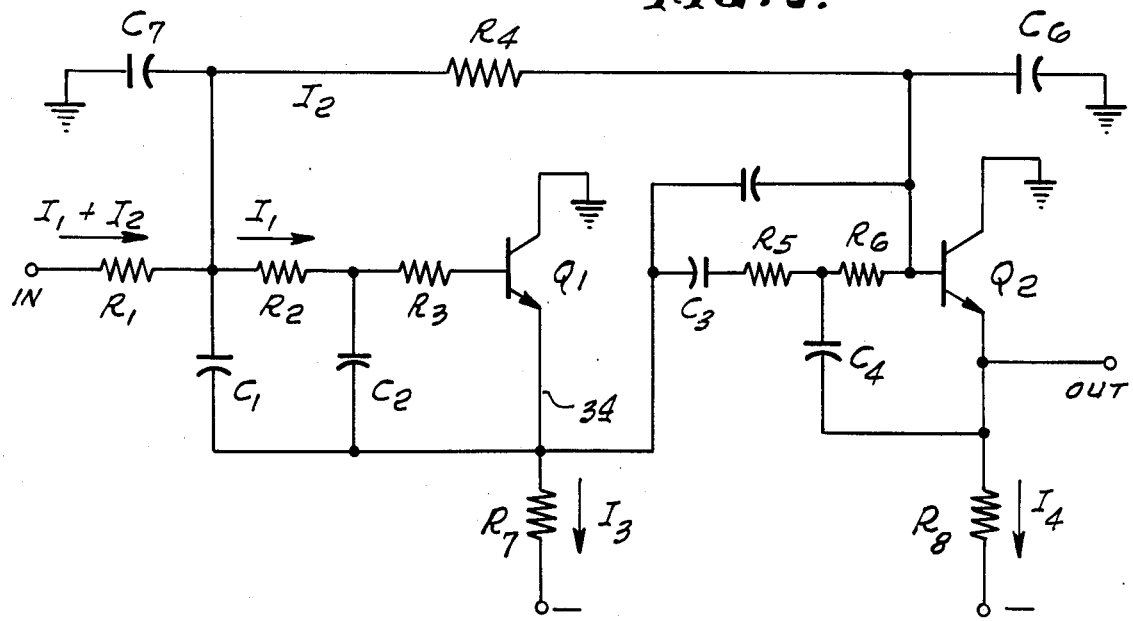
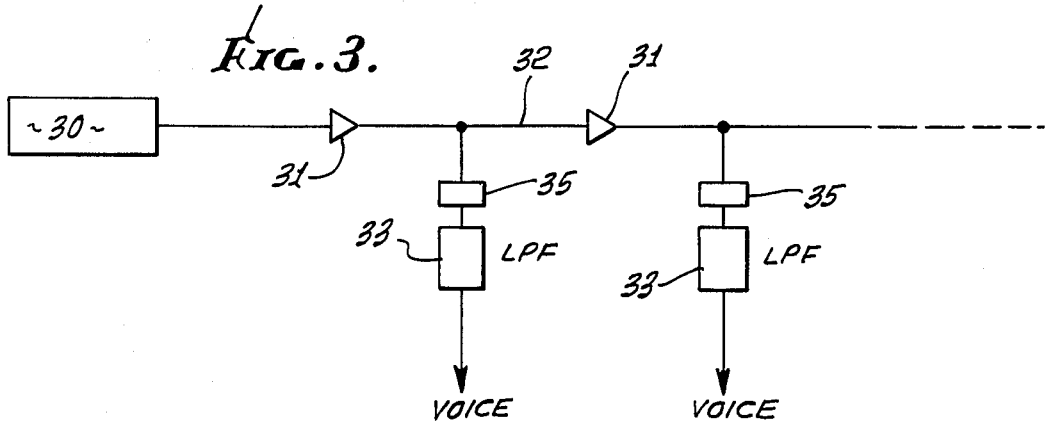

LOW PASS ACTIVE FILTER

BACKGROUND OF THE INVENTION

This invention relates generally to low pass filters, and more specifically concerns such filters wherein more than one form of filtering is necessary.

While R.C. active filters wherein emitter followers form the active devices have been widely used, a problem arises when more than one form of filtering becomes necessary. For example, if a four-pole filter is needed in one application, but a six-pole filter is required in another similar application (as for example in filter duty applications in multi-channel telephony), it becomes necessary to employ multiple active devices such as transistors (for example) in order to prevent device variations from adversely affecting performance. However, each transistor added to the active filter necessitates the employment of a different biasing point, which is a distinct disadvantage. Accordingly, there is a need for a high performance filter wherein multiple active stages are employed but which avoids the multiple biasing point difficulty.

SUMMARY OF THE INVENTION

It is a major object of the invention to overcome the above described disadvantages and problems through the provision of an R-C low pass active filter, wherein the D.C. operating point is determined by one active device, but in which multiple active devices may be employed as for such purposes as improving circuit "Q", removing component sensitivity, allowing higher operating frequences, etc.

As will be seen, this is accomplished by A.C. coupling all but the last stage in the overall active filter and connecting a high impedance biasing resistor from the filter input to the final stage biasing point. The filter retains its low pass characteristic because of this D.C. continuity from input through output, yet any number of active devices (the simplest being a transistor) can form the required high Q poles to provide the desired filter response. Furthermore, any modification of this filter to increase its order (more poles and/or zeros) or form (Butterworth, Bessel, Eliptical, etc.) does not affect the D.C. temperature stability or level of the output; i.e. this is determined by exactly one active device regardless of the total number of active devices used in the filter.

The use of this approach allows the use of cheap active devices (one, or two (etc.) transistors) to synthesize a complex filter. This, in turn, reduces size and cost of the design. Cost is further reduced because additional compensatory devices or means are not necessary when changing the order of the filter.

These and other objects and advantages of the invention, as well as the details of an illustrative embodiment, will be more fully understood from the following description and drawings, in which:

DRAWING DESCRIPTION

FIG. 1 is a filter block diagram;
FIG. 2 is a circuit diagram of one filter embodying the invention; and
FIG. 3 is a system block diagram.

DETAILED DESCRIPTION

In FIG. 1, the low pass filter 10 schematically shown includes multiple stages 11a, 11b - - - 11n, which include multiple active devices. For example, each stage may incorporate a transistor. Filter input and output terminals are indicated at 12 and 13, and circuitry including resistance and capacitance couples the stages, as indicated at 14a, 14b - - - 14n.

In accordance with the invention, high impedance biasing resistance is provided for coupling the first and last stages. Such resistance is indicated at 15 in a lead 16 connected between point 17 ahead of circuitry 14a (i.e. at the input to circuitry 14a) associated with stage 11a and point 18 between circuitry 14n and the last stage 11n. Typically, the lead 16 connects the base of a transistor associated with last stage 11n with the base of a transistor associated with first stage 11a. The parameters are such that the D.C. operating point is determined by one active device regardless of the total number of active devices used in the filter.

Referring to the example illustrated in FIG. 2, the R.C. components in a low pass filter are labelled as shown, there being two active devices (transistors $Q_1$ and $Q_2$) in the respective first and second stages. $\beta_2$ of $Q_2$ is greater than $\beta_1$ of $Q_1$, and $I_3$ is greater than $I_4$. Under these conditions, the following voltage conditions must be met:

$$V_{BE}(Q_1)+(I_3/\beta_1)(R_1+R_2+R_3)\cong V_{BE}(Q_2)+(I_4/\beta_2)(R_4)-(I_4/\beta_2)(R_1)$$

Illustrative values for the FIG. 2 components are as follows, these being representative only:

| | |
|---|---|
| $R_1$ | 5230 Ω |
| $R_2$ | 4750 Ω |
| $R_3$ | 4750 Ω |
| $R_4$ | 196,000 Ω |
| $R_5$ | 5360 Ω |
| $R_6$ | 5360 Ω |
| $R_7$ | 4700 Ω |
| $R_8$ | 6800 Ω |
| | |
| $C_1$ | 10280 pf |
| $C_2$ | 23500 pf |
| $C_3$ | 1.0 μf |
| $C_4$ | 22500 pf |
| $C_5$ | 370 pf |
| $C_6$ | 2532 pf |
| $C_7$ | 14520 pf |
| | |
| $Q_1$ | CA 3096 |
| $\beta_1 \approx 370$ | |
| $Q_2$ | MPSA 18 |
| $\beta_2 \approx 1200$ | |
| | |
| $I_3 \approx 20$ ma | |
| $I_4 \approx 1.6$ ma | |
| $V_{BE}(Q_1) \approx 0.71$ volts | |
| $V_{BE}(Q_2) \approx 0.61$ volts | |

In the system of FIG. 3, a telephony central office transmitter 30 transmits seven channels of carrier frequencies on which voice is modulated. Repeater amplifiers appear at 31 in series with the cable 32. Subscriber stations include multiple filters 33 of the type described above in FIGS. 1 and 2, to filter voice on any of the seven channels as selected by demodulators 35. Such filters eliminate signal level and D.C. operating point differences, as referred to. Note the operating point at 34 in FIG. 2, for example. Accordingly, the invention enables use of a complex, multiple active stage, low-pass filter, with low sensitivity per stage, and characterized by a fixed D.C. operating point. Such a filter is also characterized by low expense as compared with prior filters having similar qualities.

I claim:

1. In a low pass filter, the combination comprising
   (a) multiple stages including multiple active devices,
   (b) circuitry including resistance and capacitance providing AC coupling of the stages in series sequence, successive stages being DC isolated, and
   (c) high impedance biasing resistance coupled between the first and last stage inputs, whereby the DC operating point is determined by one active device.

2. The combination of claim 1 wherein said coupling circuitry between stages includes series connected resistance and branch capacitance, at least one capacitor connected in the only path between successive stages.

3. The combination of claim 2 wherein all of the active devices comprise transistors.

4. The combination of claim 3 wherein the transistors are connected as emitter followers.

5. The combination of claim 4 wherein said first and last stage input points are defined as connected to the bases of first and last stage transistors.

6. In telephony wherein multiple channels are utilized, multiple filters associated with the respective channels, each filter defined by the combination of claim 5.

7. The combination of claim 1 wherein certain of the active devices comprise transistors.

8. In telephony wherein multiple channels are utilized, multiple filters associated with the respective channels, each filter defined by the combination of claim 1.

* * * * *